US012764842B2

(12) United States Patent
Marte et al.

(10) Patent No.: US 12,764,842 B2
(45) Date of Patent: Oct. 13, 2026

(54) LED MODULE WITH ISOLATION FAULT DETECTION

(71) Applicant: Tridonic GmbH & Co KG, Dornbirn (AT)

(72) Inventors: Patrick Marte, Götzis (AT); Oliver Wynnyczenko, Lustenau (AT); David Reimondez, Dornbirn (AT)

(73) Assignee: Tridonic GmbH & Co KG, Dornbirn (AT)

( * ) Notice: Subject to any disclaimer, the term of this patent is extended or adjusted under 35 U.S.C. 154(b) by 171 days.

(21) Appl. No.: 18/835,844

(22) PCT Filed: Mar. 16, 2023

(86) PCT No.: PCT/EP2023/056769
§ 371 (c)(1),
(2) Date: Aug. 5, 2024

(87) PCT Pub. No.: WO2023/175084
PCT Pub. Date: Sep. 21, 2023

(65) Prior Publication Data

US 2025/0142702 A1 May 1, 2025

(30) Foreign Application Priority Data

Mar. 17, 2022 (EP) .................................... 22162616

(51) Int. Cl.
*H05B 45/50* (2022.01)
*G01R 31/52* (2020.01)
(Continued)

(52) U.S. Cl.
CPC ............. *H05B 45/50* (2020.01); *G01R 31/52* (2020.01); *H05B 45/375* (2020.01); *H05B 45/382* (2020.01)

(58) Field of Classification Search
CPC .... H05B 45/50; H05B 45/375; H05B 45/382; H05B 47/26; G01R 31/52; G01R 31/44
See application file for complete search history.

(56) References Cited

U.S. PATENT DOCUMENTS 7,542,764 B2 * 6/2009 Jin ....................... H04B 17/336 455/425
10,038,502 B1 * 7/2018 Seki ....................... H05B 45/50
(Continued)

OTHER PUBLICATIONS

PCT/EP2023/056769, International Search Report and Written Opinion dated May 8, 2023, 8 pages.

*Primary Examiner* — Giovanni Astacio-Oquendo
(74) *Attorney, Agent, or Firm* — Andrus Intellectual Property Law, LLP

(57) ABSTRACT

The invention relates to a method for detecting an isolation fault condition of a LED module supplied with electrical power by a non-isolated switched LED converter, the switched LED converter having a control circuit for issuing a control signal for at least one switch and being supplied with at least one feedback signal from the LED in order to implement a feedback-controlled operation of the LED module. The method comprises the step of: obtaining and analysing a signal indicating the operation frequency of the switch of the switched converter in order to evaluate the contribution of a harmonic in the frequency range of a mains voltage supplying the converter in said signal, and stopping or reducing the electrical power supplied to the LED module in case the contribution of said harmonic exceeds a given threshold value during at least a preset time period or preset number of cycles.

18 Claims, 8 Drawing Sheets

(51) Int. Cl.
*H05B 45/375* (2020.01)
*H05B 45/382* (2020.01)

(56) References Cited

U.S. PATENT DOCUMENTS

| | | | | | |
|---|---|---|---|---|---|
| 10,757,773 | B2 * | 8/2020 | Gredler | H05B 45/385 | |
| 12,256,474 | B2 * | 3/2025 | Guardado | H05B 45/58 | |
| 2011/0304272 | A1 * | 12/2011 | Ng | H05B 41/285 | 315/127 |
| 2013/0069561 | A1 * | 3/2013 | Melanson | H05B 45/28 | 315/297 |
| 2013/0258537 | A1 * | 10/2013 | Wylie | H02H 3/08 | 361/87 |
| 2014/0320009 | A1 * | 10/2014 | Goscha | H05B 41/2806 | 315/51 |
| 2015/0312986 | A1 * | 10/2015 | Bell | H05B 45/44 | 315/297 |
| 2021/0392730 | A1 * | 12/2021 | Galvano | F21S 4/26 | |
| 2023/0143313 | A1 * | 5/2023 | Luo | G01R 25/005 | 315/307 |

* cited by examiner

LED MODULE WITH ISOLATION FAULT DETECTION

CROSS REFERENCE TO RELATED APPLICATIONS

The present application is the U.S. national stage application of international application PCT/EP2023/056769 filed Mar. 16, 2023, which international application was published on Sep. 21, 2023 as International Publication WO 2023/175084 A1. The international application claims priority to European Patent Application No. 22162616.1 filed Mar. 17, 2022.

TECHNICAL FIELD OF THE INVENTION

The invention relates to a method for detecting an isolation fault condition of a LED module and a LED module.

BACKGROUND OF THE INVENTION

Luminaires are known which comprise LED modules that are mounted onto a metal surface. This metal surface usually is connected to earth (or neutral wire if no earth is available in the installation). Under normal operating conditions, the LED output is (galvanically) isolated from this mounting surface.

Depending on the construction of the luminaire and the environment conditions, it can occur that this isolation between LED output and mounting surface fails because of high humidity or condense water on the LED modules, for example. Such an isolation fault condition occurring in a metal luminaire due to condense water is, for instance, depicted in FIG. 1.

In case of such an isolation fault condition, at least part of the LED current flows into, for example, the metal housing of the luminaire. Thus, the isolation between the LED current path and the metal housing of the luminaire is faulty. In such a case, there is a need to very quickly shut down the operation of the LED driver.

If a non-isolated driver is used, a current can flow through the LED driver and LED module back to the protective earth PE (or neutral wire depending on the structure of the luminaire).

In an installation without ground-fault circuit, there is no element which would limit or stop this fault current from flowing. This could lead to the destruction of the driver or luminaire or in worst case to fire hazard.

State of the art LED drivers or converters have no protection against such an error case and are not capable to react on such an event.

Thus, it is an objective to provide an improved method for detecting an isolation fault condition of a LED module supplied with electrical power by a non-isolated switched LED converter.

SUMMARY OF THE INVENTION

The object of the present invention is achieved by the solution provided in the enclosed independent claims. Advantageous implementations of the present invention are further defined in the dependent claims.

According to a first aspect, the invention relates to a method for detecting an isolation fault condition of a LED module supplied with electrical power by a non-isolated switched LED converter, the switched LED converter having a control circuit for issuing a control signal for at least one switch and being supplied with at least one feedback signal from the LED in order to implement a feedback-controlled operation of the LED module, the method comprising the step of: Obtaining and analysing a signal indicating the operation frequency of the switch of the switched converter in order to evaluate the contribution of a harmonic in the frequency range of a mains voltage supplying the converter in said signal, and Stopping or reducing the electrical power supplied to the LED module in case the contribution of said harmonic exceeds a given threshold value during at least a preset time period or preset number of cycles.

This provides the advantage that the fault condition of the LED module can be detected in an easy and efficient manner.

In a preferred embodiment, the LED converter comprises a buck converter, preferably a synchronous buck converter. The LED converter can even comprise a boost-converter or buck-boost converter.

In a preferred embodiment, the signal indicating the operation frequency of the switch of the switched converter is the control signal from the control circuit to the at least one switch.

This provides the advantage that the LED module can accurately be monitored.

In a preferred embodiment, the control circuit is an ASIC and the signal indicating the operation frequency of the switch of the switched converter is analysed by a microcontroller.

This provides the advantage that well-known control circuits can be used. Moreover, this provides the advantage that the signal can efficiently be analysed.

In a preferred embodiment, the step of analysing a signal indicating the operation frequency of the switch of the switched converter comprises the steps of: bandpass-filtering said signal, peak-tracking the filtered signal, and comparing the peak-tracked signal with a preset threshold.

In a preferred embodiment, the electrical power is stopped by shutting down the LED converter.

This provides the advantage that damage to the LED module can be avoided.

In a preferred embodiment, the threshold value is set adaptively by the LED converter or is set via a user interface.

This provides the advantage that the threshold value can easily be set.

In a preferred embodiment, the threshold value is adaptively set by the LED converter as a defined percentage of the average of said signal.

This provides the advantage that the threshold value can easily be set.

In a preferred embodiment, the threshold is set at least 0.5% of the average value of said signal.

In a preferred embodiment, the signal is analysed with a sampling rate at least as high as double of the mains frequency.

In a preferred embodiment, the control circuitry implements a control algorithm to reduce any deviation from the feedback signal, preferably a LED current indicating signal, to a nominal value, such as e.g. a dimming signal value.

According to a second aspect, the invention relates to a non-isolated switched feedback-controlled LED converter implementing a method according to the first aspect and the implementation forms thereof.

According to a third aspect, the invention relates to a LED lighting device comprising a LED converter according to the second aspect and a LED module supplied by said converter.

In a preferred embodiment, the LED module is mounted, in a galvanically isolated manner, on a metal surface which is connected to the earth or neutral phase of the mains voltage supplying the LED converter.

According to a fourth aspect, the invention relates to a LED luminaire having a LED lighting device according to the third aspect and the implementation form thereof.

BRIEF DESCRIPTION OF THE DRAWINGS

The invention will be explained in the followings together with the figures.

DETAILED DESCRIPTION OF THE PREFERRED EMBODIMENTS

Aspects of the present invention are described herein in the context of a method for detecting an isolation fault condition of a LED module supplied with electrical power by a non-isolated switched converter.

'LED luminaire' shall mean a luminaire with a light source comprising one or more LEDs or OLEDs. LEDs are well-known in the art, and therefore, will only briefly be discussed to provide a complete description of the invention.

Figure 2:
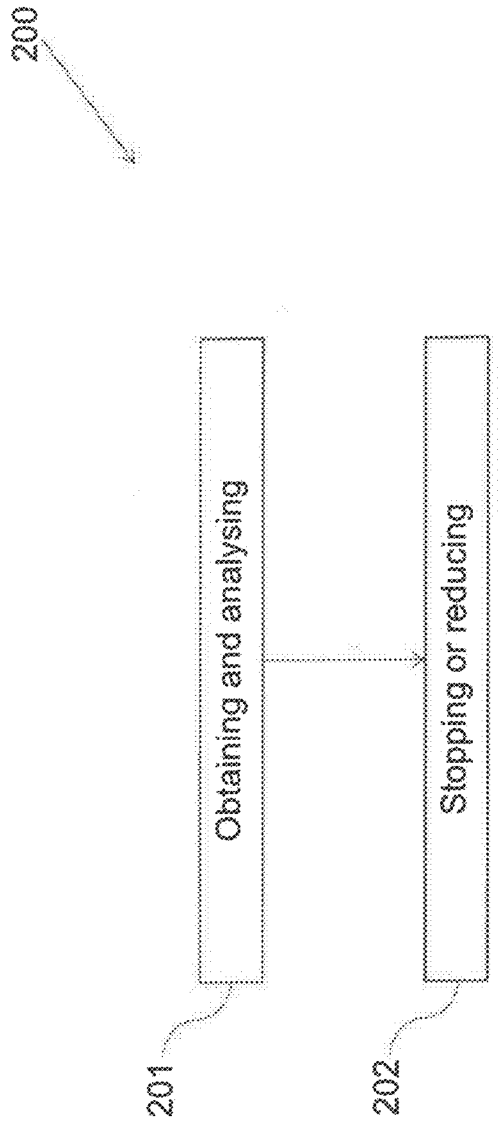
FIG. 2 shows an embodiment of a method for detecting an isolation fault condition of a LED module supplied with electrical power by a non-isolated switched converter.
Figure 7:
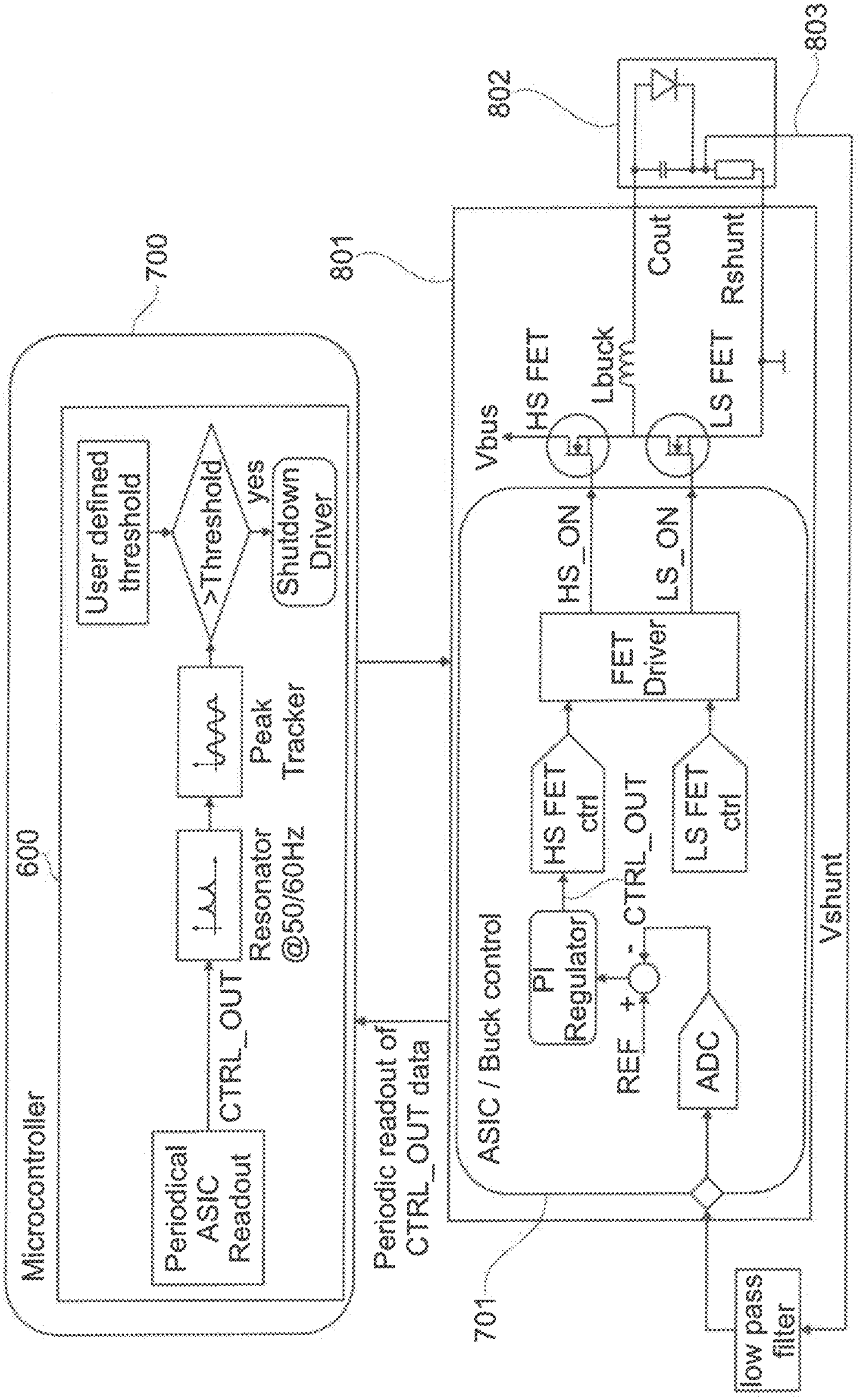
FIG. 7 shows a schematic diagram of a microcontroller, LED converter and LED module in a luminaire according to an embodiment.
Figure 8:
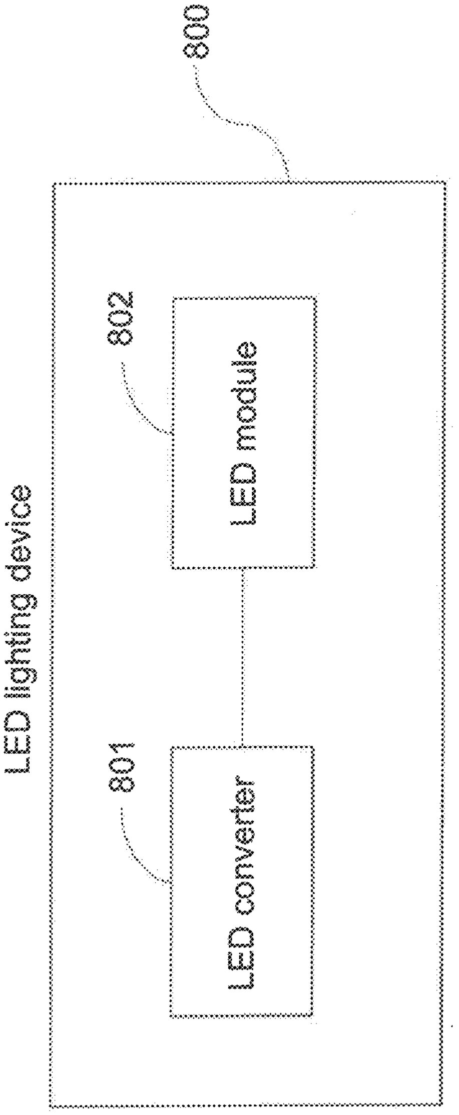
FIG. 8 shows a LED lighting device according to an embodiment.

FIG. 2 shows an embodiment of a method 200 for detecting an isolation fault condition of a LED module 802 supplied with electrical power by a non-isolated switched converter 801 (see also description of FIG. 7 and FIG. 8).

The switched LED converter 801 has a control circuit (e.g. ASIC) 701 for issuing a control signal for at least one switch HS FET, LS FET and is supplied with at least one feedback signal 803 from the LED module 802 in order to implement a feedback-controlled operation of the LED module 802. In the example the feedback signal represents the LED current obtained via a shunt $R_{Shunt}$. Thus, a feedback control of the current through the LED load is obtained. The control circuit 701 implements the feedback control by comparing the feedback signal to a reference value and applying e.g. a PI control method on any deviation thereof.

The switched converter is a non-isolated converter, in the present example a synch buck. Other examples are boost, buck, boost-buck, LLC converter etc.

The method 200 comprises the following steps: obtaining and analysing 201 a signal 300, 400 indicating the operation frequency of the switch HS FET, LS FET of the switched converter 801 in order to evaluate the contribution of a harmonic in a frequency range of a mains voltage supplying the converter 801 in said signal 300, 400, and stopping or reducing 202 the electrical power supplied to the LED module 802 in case the contribution of said harmonic exceeds a given threshold value during at least a preset time period or preset number of cycles.

This provides the advantage that a fault condition of the LED module 802 can easily and efficiently be detected and, thus, avoiding damages to the LED module 802.

Figure 3:
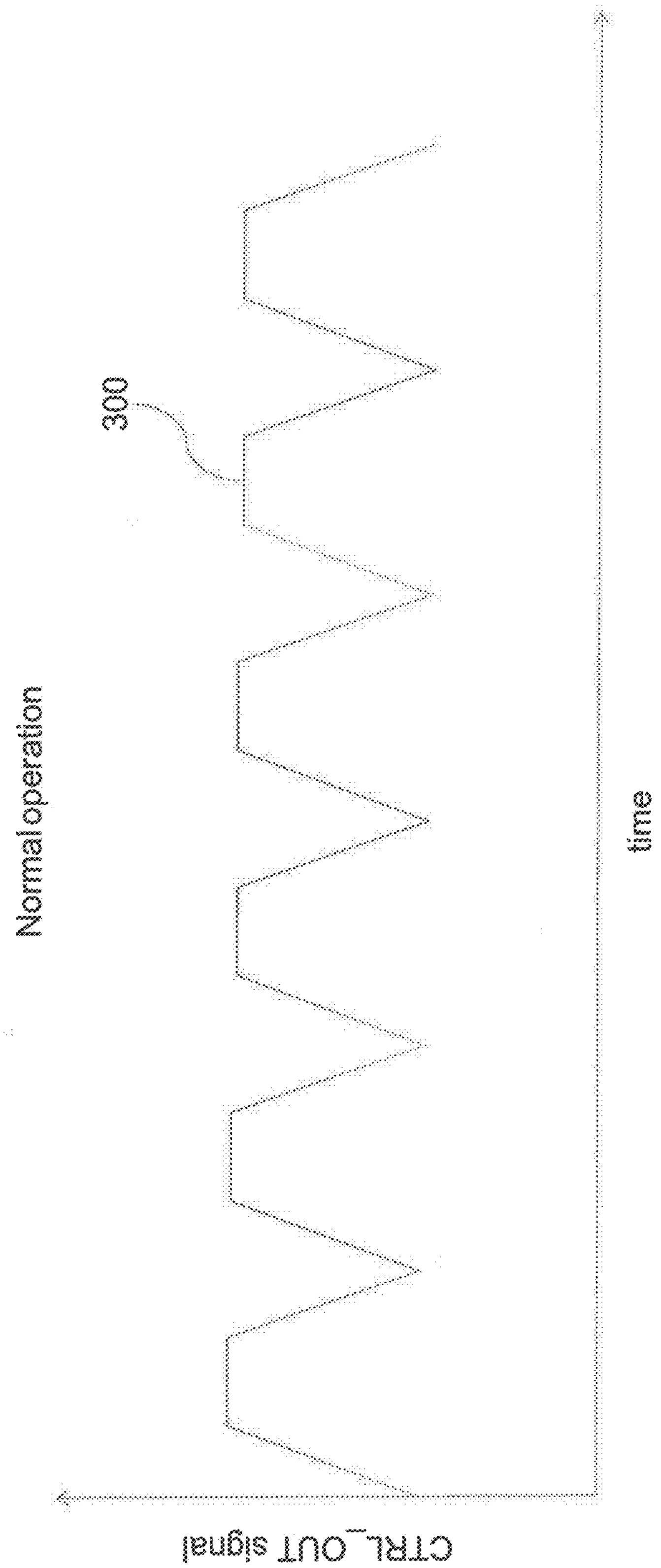
FIG. 3 shows a profile over time of a signal representing a normal operation of a LED module according to an embodiment.

FIG. 3 shows a schematic profile over time of the signal 300 representing a normal operation of the LED module 802 according to an embodiment.

In particular, the signal 300 shown in FIG. 3 is the output control signal CTRL_OUT signal of the control circuit 701. This CTRL_OUT signal can represent the signal 300 indicating the operation frequency of the switch HS_FET, LS_FET of the switched converter 801.

In particular, when looking at the CTRL_OUT signal 300, in normal conditions, a ripple component having a frequency of twice the mains frequency (thus, 100 or 120 Hz, respectively) is present.

Figure 4:
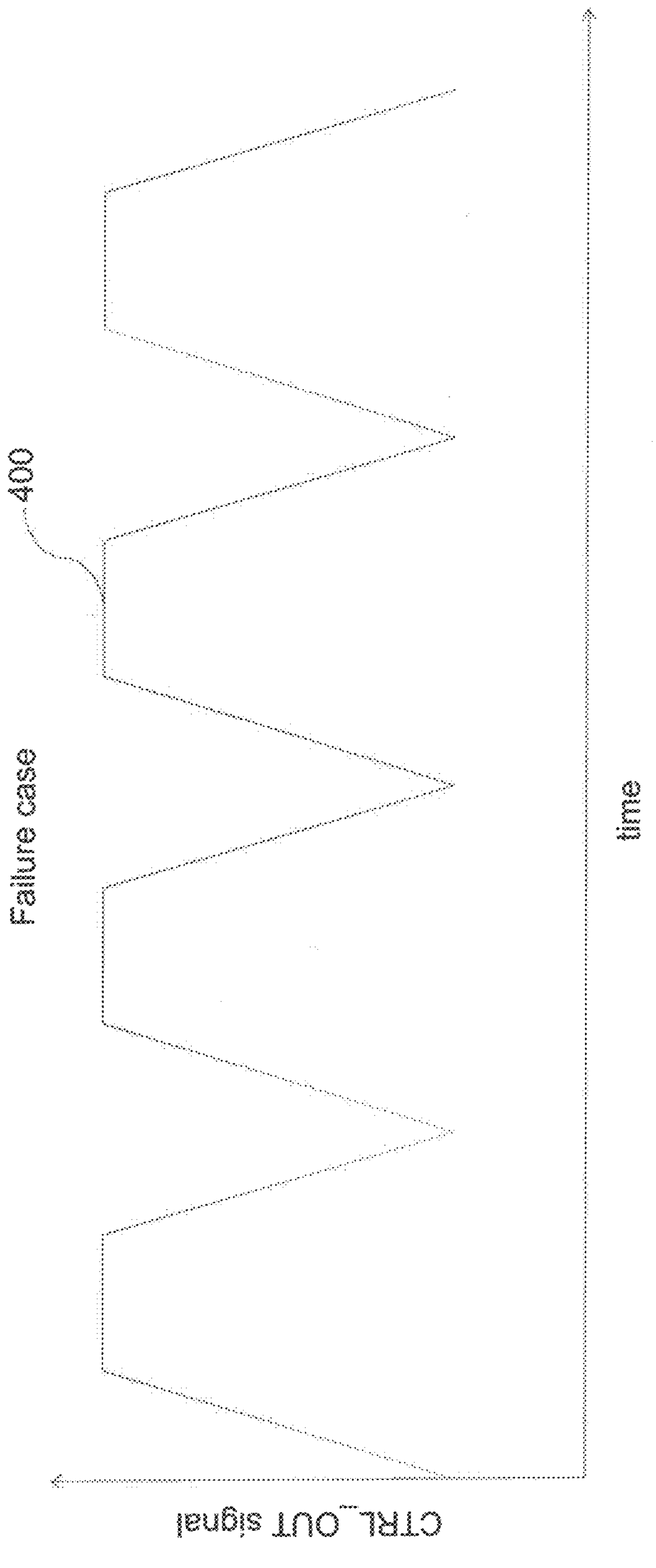
FIG. 4 shows a profile over time of a signal representing a fault operation of a LED module according to an embodiment.

FIG. 4 shows a profile over time of a signal 400 representing a fault operation of a LED module 802 according to an embodiment.

In particular, FIG. 4 shows the case of an isolation fault condition. In this case, the amplitude of the ripple is much bigger than that of the signal 300 and there is a substantial ripple component with a frequency identical to the mains frequency, thus, in the order of 50 or 60 Hz.

Therefore, at normal operation, the signal 300 indicating the operation frequency of the switch HS_FET, LS_FET of the switched converter 801 (namely, a value proportional to the working frequency of current source) stays at a constant level or with a low ripple at twice the mains frequency. This low ripple is, for instance, caused by a regulation of the PFC bus ripple in order to achieve an output current without a low-frequency ripple. Typically, this ripple is in the range of maximum +/−1% of its nominal average value with a frequency of twice the mains frequency.

However, as mentioned above, when the fault condition occurs, this ripple increases and changes its frequency from twice the mains frequency to the mains frequency. For example, the ripple is 3.5% of its nominal average value.

Summarizing, the following criteria can be applied in order to detect a fault condition of the LED module 802:

1. the signal has a mains frequency (50 Hz/60 Hz) and not a multiple of it; and/or
2. the signal ripple amplitude increases significantly.

Figure 5:
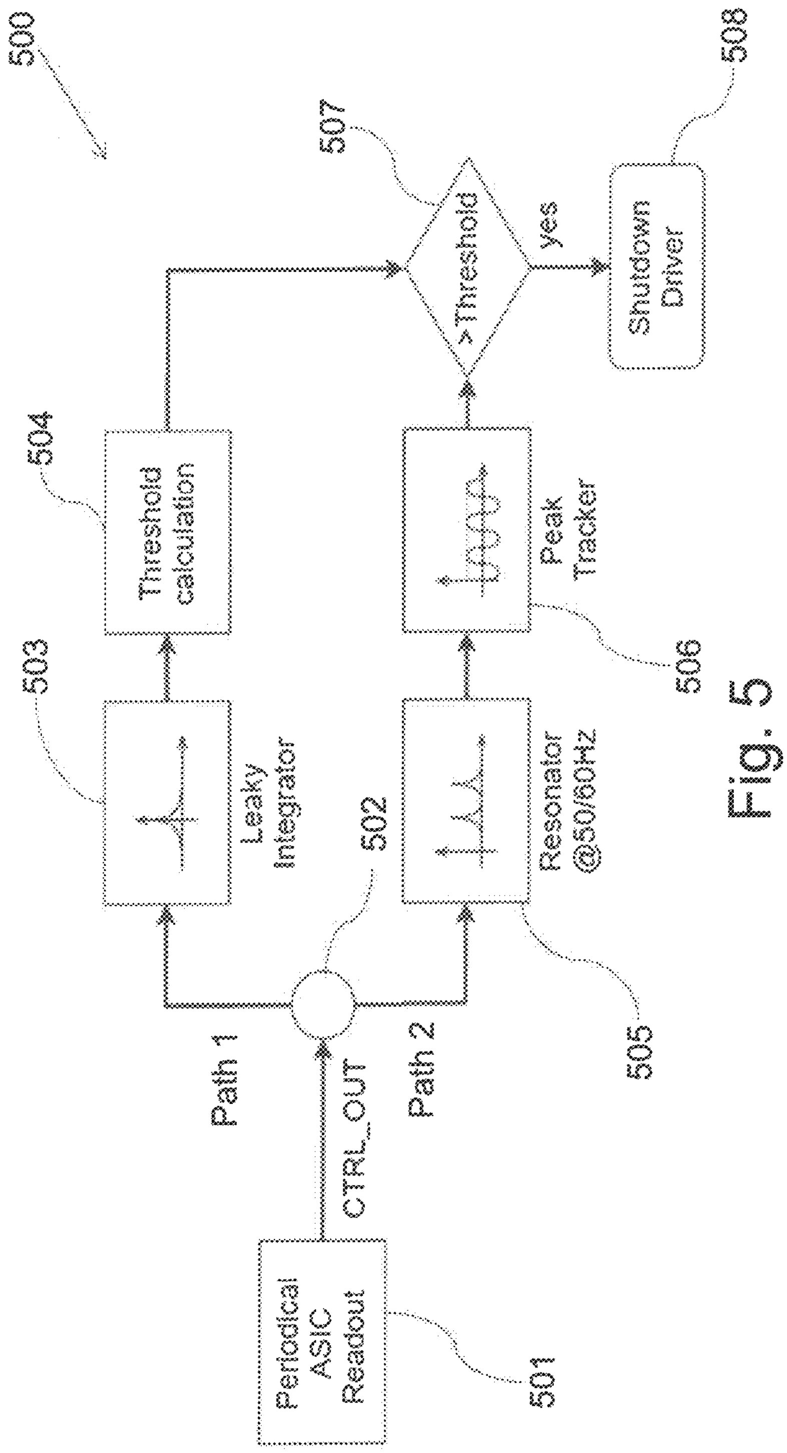
FIG. 5 shows a schematic diagram of a fault operation detection of a LED module according to an embodiment.

FIG. 5 shows a schematic diagram 500 of a fault operation detection of a LED module 802 according to an embodiment.

In a first step 501, a periodical readout of the control circuit 701 (e.g., an ASIC) output is performed in order to generate the control signal CTRL_OUT or signal 300, 400. This signal 300, 400 is subsequently processed 502 and fed into two paths: path 1 and path 2, respectively.

In path 1, the CTRL_OUT signal is input to a Leaky integrator module 503, which is equivalent to a 1st-order low-pass filter, arranged in the microcontroller 700, which filters out the DC-part of the signal to get its average. Afterwards, the output signal of the module 503 is used for a threshold value calculation (step 504). This threshold value is compared 507 to the given threshold value and, if this threshold value is higher than the given threshold value, the LED converter 801 is shut down in step 508.

The shutdown threshold value can be adjustable as a relative factor to the average value of CTRL_OUT signal 300, 400.

This provides the advantage that the shutdown threshold value is more accurate, because the level depends on the average actual value which does not change in a fault condition case, since only the ripple amplitude changes, as mentioned above.

In path 2, the CTRL_OUT signal or signal 300, 400 is given as input to a resonator 505 at 50/60 Hz frequency, which acts as a bandpass filter. Afterwards, the filtered signal is provided to a peak tracker 506. Finally, the peak-tracked signal is compared to the preset or given threshold value in step 507 and, if the peak-tracked signal is higher than the preset or given threshold value, the LED converter 801 is shut down in step 508.

In general, the shutdown level can be calculated as a relative part of the average signal value, e.g., average +5%.

This means that, if the peak tracked and bandpass filtered input signal exceeds the average +5%, a shutdown of the LED module 802 can be performed.

For example, the given threshold value is adaptively set by the LED converter 801 as a defined percentage of the average of said signal 300, 400.

For example, the given or preset threshold value is set at least 0.5% of the average value of the signal 300, 400.

Figure 6:
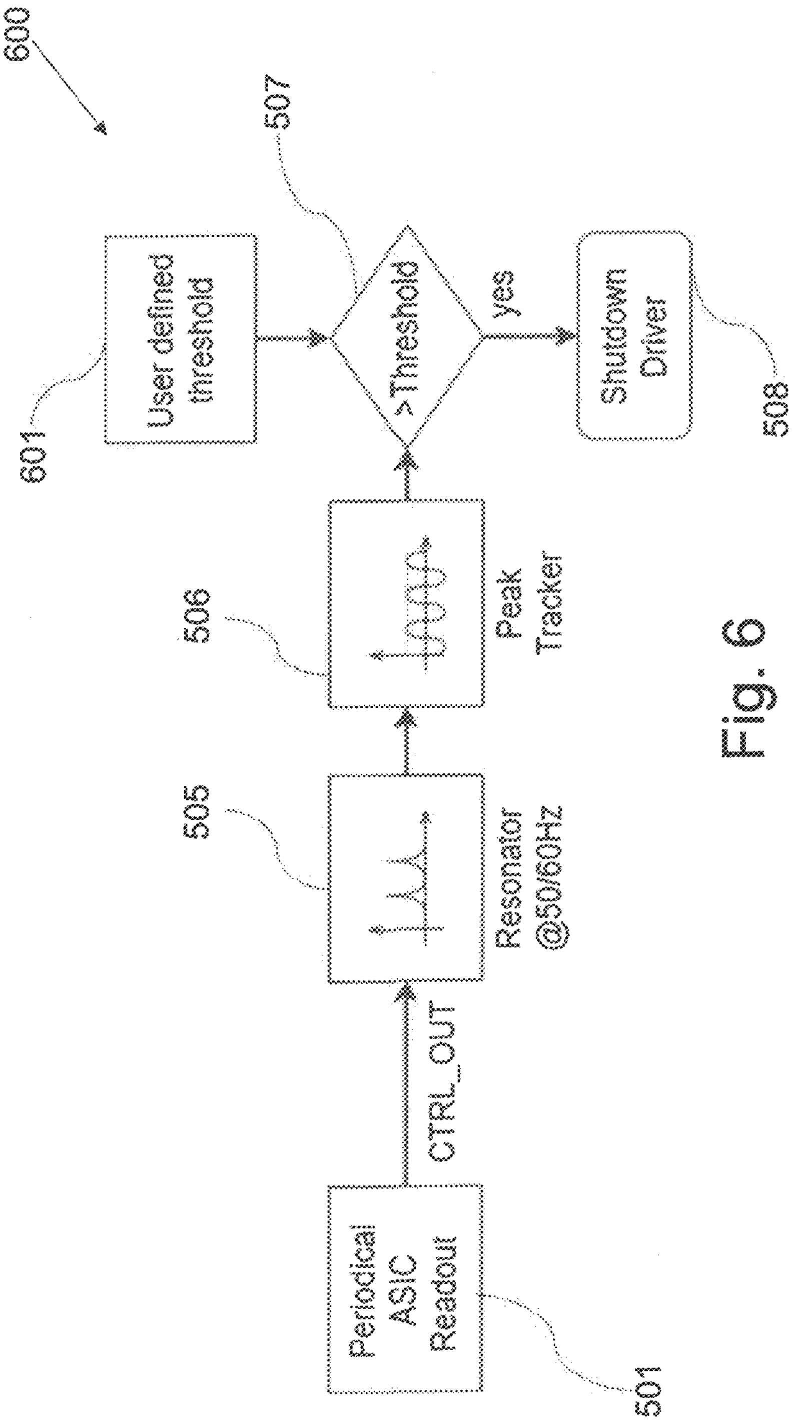
FIG. 6 shows a schematic diagram of a fault operation detection of a LED module according to an embodiment.

FIG. 6 shows a schematic diagram 600 of a fault operation detection of a LED module 802 according to an embodiment.

In the embodiment shown in FIG. 6, the modules respectively steps 501, 505, 506, 507, and 508 perform the same tasks as already described with reference to FIG. 5 and its description. However, in this embodiment, differently from the one of FIG. 5, the shutdown threshold level can be a user definable constant and can be set via a user interface 601.

This provides the advantage that it is a simple implementation which is easy to design and also accurate.

Therefore, the shutdown threshold level can be defined by the user as a fixed constant. If the peak tracked and bandpass filtered input signal exceeds this user defined level, the shutdown can be triggered. The shutdown of the LED module 802, after the given threshold value is exceeded, can be done immediately or after n-consecutive samples.

When the system shuts down, the LED converter 801, e.g. a buck converter, preferably a synchronous buck converter, stops switching, which directly interrupts the current path from mains to the LED module 802 and, thus, stopping the flow of the fault current.

It should be noted that, for both embodiments in FIG. 5 and FIG. 6, the CTRL_OUT signal or signal 300, 400 is processed in the microcontroller 700 (see also FIG. 7 for more details). Moreover, both embodiments have in common that the input signal, i.e. the signal or CTRL_OUT signal, is processed via a 50/60 Hz resonator bandpass 505 which filters out all other frequencies. Furthermore, in a next step, this bandpass filtered signal can be peak-tracked 506 to get its amplitude.

Figure 1:
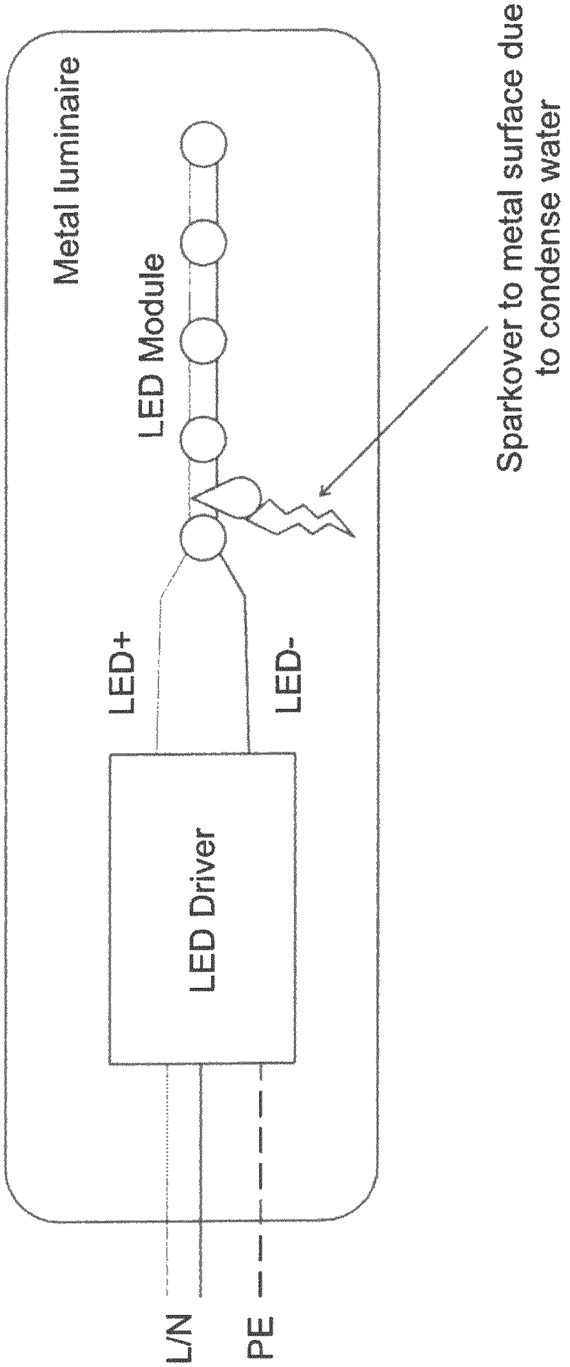
FIG. 1 shows a luminaire according to prior art.

The modules and method steps shown in FIG. 1, FIG. 5 and FIG. 6 can be implemented, respectively carried out, by the microcontroller 700.

FIG. 7 shows a schematic diagram of a, LED converter 801 with a microcontroller 700 and LED module 802 according to an embodiment.

In the embodiment shown in FIG. 7, the control circuit 701 is an ASIC and the signal 300, 400 (CTRL_OUT signal) indicating the operation frequency of the switch HS_FET, LS_FET of the switched converter 801 is analysed by the microcontroller 700.

For example, the control circuit 701 implements a control algorithm to reduce any deviation from the feedback signal 803, preferably a LED current indicating signal, to a nominal value (reference signal), such as e.g. a dimming signal value.

For example, the CTRL_OUT signal or signal 300, 400 is periodically sampled by the microcontroller 700 from the ASIC 701 in discrete time steps (e.g. approx . . . every 2 ms). It should be noticed that, for applications without ASIC 701, the switching frequency of the LED converter 801 could be monitored by the microcontroller 700.

The microcontroller 700 can be configured to read the CTRL_OUT signal of the ASIC 701 on a regularly basis. This read out interval should be lower than at least twice the mains period. Alternatively, a tracking of the LED converter 801 frequency would also be possible, this could directly be done by the microcontroller 700.

As mentioned above, in order to overcome the isolation fault problem and solving it by a quick shutdown of the operation of the LED module 802, the output signal (driving signal or CTRL_OUT signal) 300, 400 of the ASIC for the 50/60 Hz harmonic can be monitored. For example, a filter 505 for filtering the harmonic in order of 50 or 60 Hz can be applied to this ASIC readout signal 300, 400, and the magnitude of this 50/60 Hz harmonic can be compared with the given maximum threshold value. In case the detected 50/60 Hz harmonic reaches or exceeds the given maximum threshold for this harmonic, the LED module 802 can be immediately shut-down, typically by stopping the operation of one or more switches HS_FET, LS_FET of the LED converter 801. Alternatively the switching frequency and/or duty cycles of the switch(es) may be set such that the power supplied to a connected Led module is at least reduced.

In particular, the signal 300, 400 indicating the operation frequency of the switch HS_FET, LS_FET of the switched converter 801 is the control signal from the control circuit 701 to the at least one switch (HS FET or LS FET). The microcontroller 700 can be configured to analyse the signal 300, 400 with a sampling rate at least as high as double of the mains frequency.

FIG. 8 shows a LED lighting device 800 according to an embodiment.

The LED lighting device 800 comprises the LED converter 801 and the LED module 802 supplied by said converter 801.

For example, the LED module 802 is mounted, in a galvanically isolated manner, on a metal surface which is connected to the earth or neutral phase of the mains voltage supplying the LED converter 801.

All features of all embodiments described, shown and/or claimed herein can be combined with each other.

While various embodiments of the present invention have been described above, it should be understood that they have been presented by way of example only and not limitation. Numerous changes to the disclosed embodiments can be made in accordance with the disclosure herein without departing from the spirit of scope of the invention. Thus, the breadth and scope of the present invention should not be limited by any of the above-described embodiments. Rather, the scope of the invention should be defined in accordance with the following claims and their equivalence.

Although the invention has been illustrated and described with respect to one or more implementations, equivalent alternations and modifications will occur to those skilled in the art upon the reading of the understanding of the specification and the annexed drawings. In addition, while a particular feature of the invention may have been disclosed with respect to only of the several implementations, such features may be combined with one or more other features of the other implementations as may be desired and advantage for any given or particular application.

The invention claimed is:

1. A method (200) for detecting an isolation fault condition of a LED module (802) supplied with electrical power by a non-isolated switched LED converter (801), the switched LED converter (801) having a control circuit (701) for issuing a control signal for at least one switch (HS_FET, LS_FET) and being supplied with at least one feedback signal (803) from the LED module (802) in order to implement a feedback-controlled operation of the LED module (802), the method (200) comprising the step of:

obtaining and analysing (201) a signal (300, 400) indicating the operation frequency of the switch (HS_FET, LS_FET) of the switched converter (801) in order to evaluate the contribution of a harmonic in the frequency range of a mains voltage supplying the converter (801) in said signal (300, 400), and stopping or reducing (202) the electrical power supplied to the LED module (802) in case the contribution of said harmonic exceeds a given threshold value during at least a preset time period or preset number of cycles; and wherein the signal indicating the operation frequency of the switch (HS_FET, LS_FET) of the switched converter (801) is the control signal from the control circuit (701) to the at least one switch (HS_FET, LS_FET).

2. The method (200) of claim 1, wherein the LED converter (801) comprises a synchronous buck converter.

3. The method (200) of claim 1, wherein the control circuit (701) is an ASIC and the signal (300, 400) indicating the operation frequency of the switch (HS_FET, LS_FET) of the switched converter (801) is analysed by a microcontroller (700).

4. The method (200) according to claim 1, wherein the electrical power is stopped by shutting down the LED converter (801).

5. The method (200) according to claim 1, the threshold value is set adaptively by the LED converter (801) or is set via a user interface (601).

6. The method (200) according to claim 5, the threshold value is adaptively set by the LED converter (801) as a defined percentage of the average of said signal (300, 400).

7. The method (200) of claim 1, the threshold is set at at least 0.5% of the average value of said signal (300, 400).

8. The method (200) of claim 1, the signal (300, 400) is analysed with a sampling rate at least as high as double of the mains frequency.

9. The method (200) of claim 1, the control circuitry (701) implements a control algorithm to reduce any deviation from the feedback signal (803), comprising a LED current indicating signal, to a nominal value comprising, a dimming signal value.

10. An LED lighting device (800) implementing the method (200) according to claim 1 comprising the non-isolated switched LED converter (801) and the LED module (802) supplied by said converter (801).

11. The LED lighting device (800) of claim 10, wherein the LED module (802) is mounted, in a galvanically isolated manner, on a metal surface which is connected to the earth or neutral phase of the mains voltage supplying the LED converter (801).

12. A LED luminaire having the LED lighting device (800) according to claim 10.

13. A method (200) for detecting an isolation fault condition of a LED module (802) supplied with electrical power by a non-isolated switched LED converter (801), the switched LED converter (801) having a control circuit (701) for issuing a control signal for at least one switch (HS_FET, LS_FET) and being supplied with at least one feedback signal (803) from the LED module (802) in order to implement a feedback-controlled operation of the LED module (802), the method (200) comprising the step of:

obtaining and analysing (201) a signal (300, 400) indicating the operation frequency of the switch (HS_FET, LS_FET) of the switched converter (801) in order to evaluate the contribution of a harmonic in the frequency range of a mains voltage supplying the converter (801) in said signal (300, 400), and stopping or reducing (202) the electrical power supplied to the LED module (802) in case the contribution of said harmonic exceeds a given threshold value during at least a preset time period or preset number of cycles;

wherein the step of analysing (201) a signal (300, 400) indicating the operation frequency of the switch (HS_FET, LS_FET) of the switched converter (801) comprises the steps of:

bandpass-filtering (505) said signal, peak-tracking (506) the filtered signal, and comparing (507) the peak-tracked signal with a preset threshold.

14. The method (200) according to claim 13, wherein the electrical power is stopped by shutting down the LED converter (801).

15. The method (200) according to claim 13, the threshold value is set adaptively by the LED converter (801) or is set via a user interface (601).

16. The method (200) according to claim 15, the threshold value is adaptively set by the LED converter (801) as a defined percentage of the average of said signal (300, 400).

17. The method (200) of claim 13, the threshold is set at least 0.5% of the average value of said signal (300, 400).

18. The method (200) of claim 13, the signal (300, 400) is analysed with a sampling rate at least as high as double of the mains frequency.

* * * * *